(12) United States Patent
Ryoo et al.

(10) Patent No.: US 6,667,233 B2
(45) Date of Patent: Dec. 23, 2003

(54) METHOD FOR FORMING A SILICIDE LAYER OF SEMICONDUCTOR DEVICE

(75) Inventors: Chang Woo Ryoo, Ichon-shi (KR); Jeong Youb Lee, Seoul (KR); Yong Sun Sohn, Sungnam-shi (KR)

(73) Assignee: Hynix Semiconductor Inc, Kyoungki-Do (KR)

( * ) Notice: Subject to any disclaimer, the term of this patent is extended or adjusted under 35 U.S.C. 154(b) by 39 days.

(21) Appl. No.: 10/328,969

(22) Filed: Dec. 24, 2002

(65) Prior Publication Data

US 2003/0119309 A1 Jun. 26, 2003

(30) Foreign Application Priority Data

Dec. 26, 2001 (KR) ........................................ 2001-84903

(51) Int. Cl.$^7$ .......................................... H01L 21/4763
(52) U.S. Cl. ........................ 438/649; 438/682; 438/721; 438/755
(58) Field of Search ................................ 438/197, 381, 438/637, 649, 651, 655, 682, 692, 721, 755, 770, 775

(56) References Cited

U.S. PATENT DOCUMENTS

| | | | | |
|---|---|---|---|---|
| 5,648,287 A | * | 7/1997 | Tsai et al. ................... | 438/586 |
| 5,998,873 A | * | 12/1999 | Blair et al. .................. | 257/766 |
| 6,162,675 A | * | 12/2000 | Hwang et al. ............... | 438/241 |
| 6,255,701 B1 | | 7/2001 | Shimada ..................... | 257/384 |
| 6,271,120 B1 | | 8/2001 | Huang et al. ............... | 438/627 |

* cited by examiner

Primary Examiner—David Nhu
(74) Attorney, Agent, or Firm—Marshall, Gerstein & Borun

(57) ABSTRACT

A method for forming a silicide layer of a semiconductor memory device is disclosed. A silicide layer is formed in an impurity junction region through a contact hole exposing the impurity junction region on a semiconductor substrate. Here, two thermal annealing processes are performed on the semiconductor substrate on which a metal layer is deposited, by using low and high temperature up speeds and maintaining the semiconductor substrate under the highest temperature for less than one second, and then dropping the temperature at high speed. The process for removing a portion of the metal layer which did not react is carried out. As a result, a shallow junction can be formed in a very small devices, and deterioration of an electrical property of the semiconductor device is minimized by reducing junction leakage current, which results in the rapid operation of the device.

6 Claims, 2 Drawing Sheets

METHOD FOR FORMING A SILICIDE LAYER OF SEMICONDUCTOR DEVICE

BACKGROUND

1. Technical Field

A method for forming a silicide layer of a semiconductor device is disclosed, and, in particular, in the disclosed method, the silicide layer has a low specific resistance and chemical stability and is positioned below a portion where a defective layer is formed, thereby improving at least one operational property of the resultant CMOS.

2. Description of the Related Art

A silicide layer has a resistance 20 times lower than that of a source/drain region or a polysilicon gate. The silicide layer is essentially used in the CMOS. The silicide layer improves an operation speed which is one of the major factors which indicate an operational property of a semiconductor device.

The silicide layer is formed by depositing a thin metal film on a semiconductor substrate and thermally treating the resulting structure. Since the silicide layer has a low specific resistance and chemical stability and is positioned below portion where a defective layer is formed, it is used in the most of the contact processes.

As the semiconductor device is highly integrated, a parasitic resistance as well as a channel resistance existing below a gate increases in a degradation of the performance of the device. Therefore, the silicide layer having a lower resistance than a silicon is used in the source/drain region or polysilicon gate to manufacture the semiconductor device.

In the conventional art, the silicide layer is formed by performing a furnace annealing process wherein a metal such as Ti or Co reacts with Si, and more recently a rapid thermal annealing (RTA) process has been used due to prevalence of the RTA equipment.

In the conventional RTA process, a primary thermal annealing process is performed at a low temperature. As a result, Ti reacts with Si to form $C_{49}$-$TiSi_2$ or $TiSi$, and Co reacts with Si to form $CoSi$.

An electric specific resistance of the two metals is very high, approximately 100 $\mu\Omega\cdot cm$. Therefore, a secondary thermal annealing process is carried out to lower the specific resistance at a high temperature ranging from 800 to 900° C. with about 20° C. sec increase. Here, Ti forms crystalline $C_{54}$-$TiSi_2$ and Co forms crystalline $CoSi_2$.

the conventional RTA process, a deterioration phenomenon called agglomeration at the grain boundary of silicide grains and Si due to a high temperature and a low rise speed of a temperature. When Ti or Co having a unit thickness reacts with Si to respectively form $TiSi_2$ or $CoSi_2$, Ti and Co consumes about 2.2 times and 3.6 times of the substrate, respectively.

Especially, $CoSi_2$ which is more than 50% thicker than $TiSi_2$, reduces a physical distance between the $CoSi_2$ and Si diode junction interface in the source/drain region, which results in an excessive junction leakage current.

As described above, the conventional silicide layer decreases an actual width of the junction interface due to large consumption of the substrate. A shallow junction cannot be formed in a small device. In addition, excessive junction leakage current is generated thereby deteriorating the properties of the silicide layer.

SUMMARY OF THE DISCLOSURE

Accordingly, a method for forming a silicide layer of a semiconductor device is disclosed wherein a shallow junction can be formed in a very small device, and which minimizes the deterioration of an electrical property of the semiconductor device by reducing junction leakage current, when the silicide layer is formed using Ti and Co as source materials.

In order to achieve this improved performance, a method for forming a silicide layer of a semiconductor device is disclosed which comprises: (a) forming a lower insulating layer having a contact hole partially exposing an impurity junction region of a transistor on a semiconductor substrate; (b) forming a metal layer on the semiconductor substrate including the exposed portion of the impurity junction region and the sidewall of the contact hole; (c) performing a thermal annealing process by raising the temperature of the semiconductor substrate up to 600° C. at a speed ranging from 20 to 50° C. second; (d) performing a thermal annealing process by raising the temperature of the semiconductor substrate up to a range from 800 to 900° C. at a speed ranging from 200 to 300° C. second, wherein the semiconductor substrate is maintained at the highest temperature for less than one second; (e) forming a silicide layer on the impurity junction dropping temperature of the semiconductor substrate to below 700° C. at a speed ranging from 70 to 90° C. second; and (f) removing the non-reacted metal layer from the semiconductor substrate.

In addition, the impurity junction region is formed by using a $1 \times e^{15}$ to $3 \times e^{15}$ ions/cm² dose of $As_{75}$ with an ion implantation energy ranging from 15 to 30 KeV in case of an n-type transistor, and the impurity junction region is formed by using a $1 \times e^{15}$ to $3 \times e^{15}$ ions/cm² dose of $BF_2$ with an ion implantation energy ranging from 10 to 20 KeV in case of a p-type transistor. The metal layer is Ti layer or Co layer. Parts (c) and (d) can be consecutively performed in one equipment. Here, parts (c) and (d) are performed by rotating semiconductor substrate at the atmosphere of $N_2$ gas, at a state of $O_2$ free. Part (f) is performed using one of $H_2SO_4$ solution and $NH_4OH$ solution.

A high rise speed of a temperature, a high drop speed of a temperature and a temperature are controlled through Spike RTA equipment so that an amorphous phase can be easily transformed to a crystalline phase. In addition, agglomeration with the implanted impurity is reduced due to deep reaction into the semiconductor substrate, and the time period during which the semiconductor substrate is maintained at a process temperature is controlled, thereby forming a complete crystalline silicide layer according to reaction between a metal Ti or Co and Si.

Moreover, a shallow junction can be formed and a junction leakage current property of the device can be improved by adjusting a physical distance between a silicide layer and Si diode junction interface in a source/drain region.

BRIEF DESCRIPTION OF THE DRAWINGS

The disclosed methods will become better understood with reference to the accompanying drawings which are given only by way of illustration and thus are not limitative of this disclosure, wherein.

DETAILED DESCRIPTION OF THE PRESENTLY PREFERRED EMBODIMENTS

A method for forming a silicide layer of a semiconductor device in accordance with a preferred embodiment will now be described in detail with reference to the accompanying drawings.

FIGS. 1a to 1d are views illustrating sequential steps of the method for forming the silicide layer of the semiconductor device in accordance with a preferred embodiment.

Figure 1A:
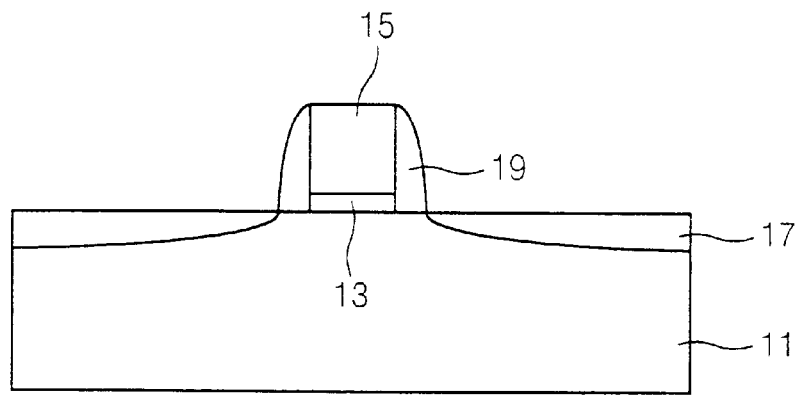
FIGS. 1a to 1d are views illustrating sequential steps of a method for forming a silicide layer of a semiconductor device in accordance with the preferred embodiment.

Referring to FIG. 1a, a gate electrode 15 is formed on a semiconductor substrate 11. Here, a gate oxide film 13 is positioned at the interface between the gate electrode 15 and the semiconductor substrate 11.

An insulating film spacer 19 is formed on the sidewall of the gate electrode 15, and an impurity junction region 17 is formed on the semiconductor substrate 11 using the gate electrode 15 and the insulating film spacer 19 as masks.

The impurity junction region 17 is an n-type or p-type depending on the type of the transistor, i.e. an NMOS or a PMOS in a CMOS. When the transistor is an n-type, the impurity junction region 17 is formed by using a $1 \times e^{15}$ to $3 \times e^{15}$ ions/cm$^2$ dose of $As_{75}$ with an ion implantation energy of 15 to 30 KeV, and when the transistor is a p-type, the impurity junction region 17 is formed by using a $1 \times e^{15}$ to $3 \times e^{15}$ ions/cm$^2$ dose of $BF_2$ with an ion implantation energy of 10 to 20 KeV.

Figure 1B:
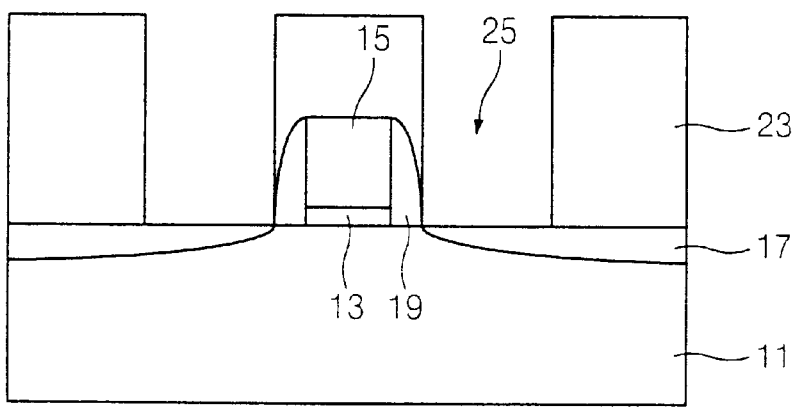

Referring to FIG. 1b, a lower insulating layer 23 is formed on the entire surface of the resultant structure, and a contact hole 25 is formed to partially expose the impurity junction region 17 via a photo-etching process using a contact mask (not shown).

Figure 1C:
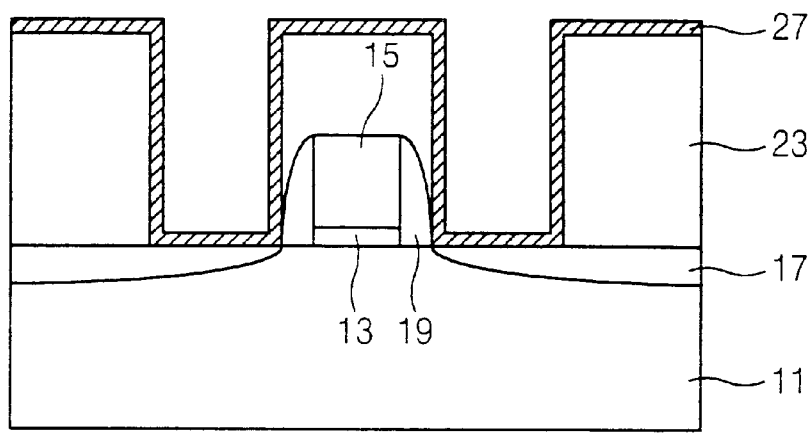

Referring to FIG. 1c, a metal layer 27 is formed on the entire surface of the resultant structure via conventional sputtering method using preferably Ti or Co.

Thereafter, a primary thermal annealing process is performed on the resultant structure. The temperature is raised up to approximately 600° C. at a speed ranging from 20 to 50° C. second.

Here, when the metal layer 27 is composed of Ti, Ti exists in the form of $C_{49}$-$TiSi_2$, TiSi or a mixed state of Ti and Si after the primary thermal annealing process, and an electric specific resistance shows a high resistance approximately 100 $\mu\Omega$·cm.

Thereafter, a secondary thermal annealing process is performed on the resultant structure. The temperature is raised up to the 800 to 900° C. range at a speed ranging from 200 to 300° C. second. Here, the highest temperature is maintained for less than one second, thereby thermally annealing the residual metal layer 27 which has not reacted during the primary thermal annealing process.

During the secondary thermal annealing process, Ti or Co rapidly reacts with Si by increasing the speed to the range of 200 to 300° C. second and decreasing the time period during which the temperature is maintained at the highest temperature, thereby reducing loss of the semiconductor substrate. In addition, junction leakage current is decreased by forming a shallow junction.

Thereafter, the temperature is dropped to below 700° C. at a speed ranging from 70 to 90° C. second, and a silicide layer 29 is formed on the impurity junction region 17, i.e. at the bottom portion of the contact hole 25.

Here, agglomeration is not generated at the grain boundary of silicide grains and Si by increasing the speed to a range of 70 to 90° C. second, thereby preventing deterioration of a property of the device.

The primary thermal annealing process, the secondary thermal annealing process and the temperature lowering process are consecutively performed in one equipment by injecting $N_2$ gas to a $O_2$ free atmosphere with the semiconductor substrate 11 rotating.

Figure 1D:
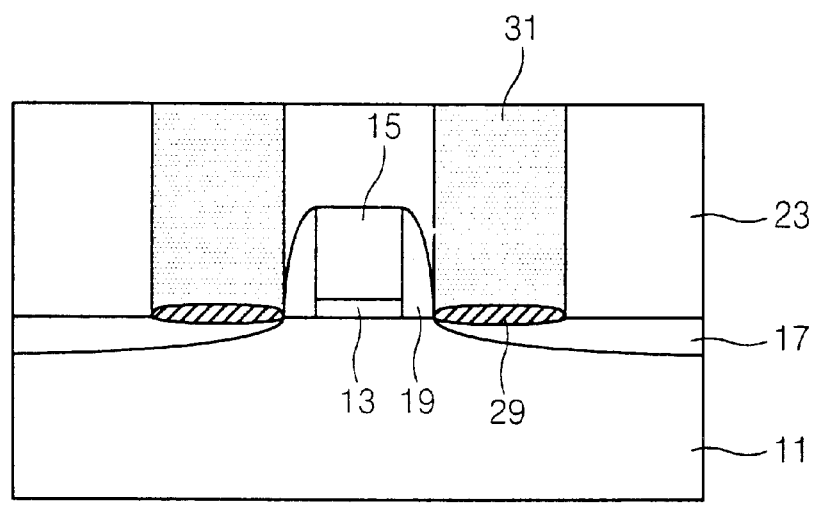

Referring to FIG. 1d, the metal layer 27 which has not reacted during the silicide layer formation process is removed by using preferably, $H_2SO_4$ or $NH_4OH$ solution.

Here, the metal layer which did not react refers to the portion of metal layer 27 other than the portion of the metal layer 27 contacting the impurity junction region 17.

A bit line contact plug 31 is formed by filling the contact hole 25 which has the silicide layer 29 at the bottom portion, and a bit line is formed to contact the semiconductor substrate 11 via the bit line contact plug 31.

As discussed earlier, the silicide layer is formed on the impurity junction region through the contact hole for exposing the impurity junction region on the semiconductor substrate. Here, the two thermal annealing processes are performed on the semiconductor substrate on which the metal layer is formed, by using low and high temperature up speeds and maintaining the semiconductor substrate under the highest temperature for less than one second, and then dropping the temperature at high speed. The process for removing the portion of the metal layer which did not react is carried out. As a result, the shallow junction can be formed in the very small devices, and deterioration of the electrical property of the semiconductor device is minimized by reducing the junction leakage current, which results in the rapid operation of the device.

As the disclosed methods may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A method for forming a silicide layer of a semiconductor device, the method comprising:
    (a) forming a lower insulating layer having a contact hole partially exposing an impurity junction region of a transistor on a semiconductor substrate;
    (b) forming a metal layer on the semiconductor substrate including the exposed portion of the impurity junction region and the sidewall of the contact hole;
    (c) performing a thermal annealing process by raising the temperature of the semiconductor substrate up to 600° C. at a speed ranging from 20 to 50° C. second;
    (d) performing a thermal annealing process by raising the temperature of the semiconductor substrate up to a range from 800 to 900° C. at a speed ranging from 200 to 300° C. second, wherein the semiconductor substrate is maintained at the highest temperature for less than one second;
    (e) forming a silicide layer on the impurity junction dropping temperature of the semiconductor substrate to below 700° C. at a speed ranging from 70 to 90° C. second; and
    (f) removing the non-reacted metal layer from the semiconductor substrate.

2. The method according to claim 1, wherein the impurity junction region is formed by using a $1 \times e^{15}$ to $3 \times e^{15}$ ions/cm$^2$ dose of $AS_{75}$ with an ion implantation energy ranging from 15 to 30 KeV in case of an n-type transistor, and the impurity junction region is formed by using a $1 \times e^{15}$ to $3 \times e^{15}$ ions/cm$^2$ with an ion implantation energy ranging from 10 to 20 KeV in case of a p-type transistor.

3. The method according to claim 1, wherein the metal layer is Ti layer or Co layer.

4. The method according to claim 1, wherein parts (c) and (d) are consecutively performed in one equipment.

5. The method according to claim 1, wherein parts (c) and (d) are performed by rotating semiconductor substrate at the atmosphere of $N_2$ gas, at a state of $O_2$ free.

6. The method according to claim 1, wherein part (f) is performed using one of $H_2SO_4$ solution and $NH_4OH$ solution.

* * * * *

UNITED STATES PATENT AND TRADEMARK OFFICE
CERTIFICATE OF CORRECTION

PATENT NO.     : 6,667,233 B2
DATED          : December 23, 2003
INVENTOR(S)    : Chang W. Ryoo et al.

It is certified that error appears in the above-identified patent and that said Letters Patent is hereby corrected as shown below:

<u>Title page,</u>
Item [75], Inventors, please delete "Ichon-shi" and replace with -- Kyoungki-do --; also delete "Sungnan-shi" and replace with -- Kyoungki-do --.

<u>Column 4,</u>
Line 35, please delete "the sidewall" and replace with -- a sidewall --.
Line 38, please delete "20 to 50°C second;" and replace with -- 20 to 50°C/second; --.
Line 42, please delete "300°C second," and replace with -- 300°C/second, --.
Lines 47-48, please delete "90°C second;" and replace with -- 90°C/second; --.
Line 49, please delete "removing the" and replace with -- removing a --.
Line 50, please delete "method-according" and replace with -- method according --.
Lines 54-55, please delete "3xe$^{15}$ions/cm$^2$ with an ion implantation" and replace with -- 3xe$^{15}$ions/cm$^2$ dose of BF$_2$ with an ion implantation --.

Signed and Sealed this

Eighteenth Day of May, 2004

JON W. DUDAS
*Acting Director of the United States Patent and Trademark Office*